US 6,559,738 B2

(12) United States Patent
Tsuruoka et al.

(10) Patent No.: US 6,559,738 B2
(45) Date of Patent: May 6, 2003

(54) UNIDIRECTIONAL TRANSDUCER AND SAW FILTER COMPRISING THE SAME

(75) Inventors: Tatsuya Tsuruoka, Nagoya (JP); Yasufumi Horio, Nagoya (JP); Kenji Suzuki, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/726,073

(22) Filed: Nov. 29, 2000

(65) Prior Publication Data

US 2002/0167377 A1 Nov. 14, 2002

(30) Foreign Application Priority Data

Oct. 31, 2000 (JP) ........................ 2000-333283

(51) Int. Cl.$^7$ ............................ H03H 9/64; H03H 9/145
(52) U.S. Cl. .................... 333/193; 333/196; 310/313 B
(58) Field of Search ................. 333/193–196; 310/313 B

(56) References Cited

U.S. PATENT DOCUMENTS

| 5,703,427 A | * | 12/1997 | Solal et al. | 333/195 X |
| 5,896,071 A | * | 4/1999 | Dai et al. | 333/193 |
| 5,952,765 A | * | 9/1999 | Garber et al. | 333/195 X |
| 6,104,260 A | * | 8/2000 | Yamada et al. | 333/195 X |
| 6,211,600 B1 | * | 4/2001 | Martin | 310/313 D |

FOREIGN PATENT DOCUMENTS

JP  10-242790  *  9/1998

OTHER PUBLICATIONS

P. Ventura et al.; "A New Concept in SPUDT Design: the RSPUDT (Resonant SPUDT)", *1994 IEEE Ultrasonics Symposium Proceedings*, vol. 1, pp. 1–6, Nov. 1994.*

J.M. Hodé et al.; "SPUDT—Based Filters: Design Principles, and Optimization", *1995 IEEE Ultrasonics Symposium Proceedings*, vol. 1, pp. 39–50, Nov. 1995.*

* cited by examiner

Primary Examiner—Barbara Summons
(74) Attorney, Agent, or Firm—Burr & Brown

(57) ABSTRACT

A unidirectional transducer for a SAW filter having a first group (D) including electrode finger (21) and electrode fingers (14) and (16) arranged at center distances of $3\lambda/8$ and $5\lambda/8$ in a direction opposite to the propagation direction of the surface acoustic wave from electrode finger (21); a second group (E) including electrode fingers (22), (15) and (20) arranged at center distances of $10\lambda/8$, $13\lambda/8$ and $15\lambda/8$ in the propagation direction from electrode finger (21); and a third group (F) including electrode fingers (17), (18) and (19) arranged at center distances of $3\lambda/8$, $5\lambda/8$ and $7\lambda/8$ in the propagation direction from electrode finger (21).

2 Claims, 3 Drawing Sheets

FIG. 1 - Prior Art
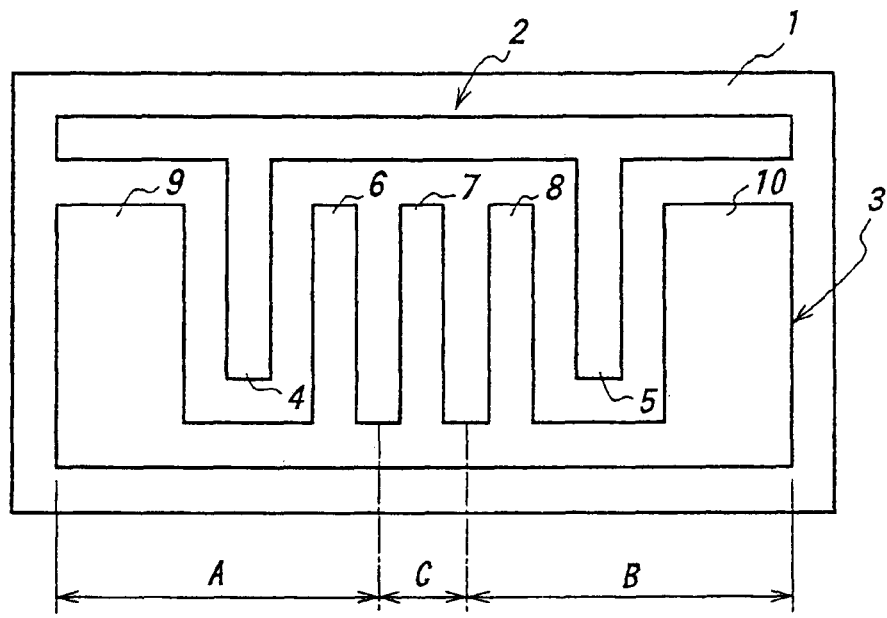
FIG. 2
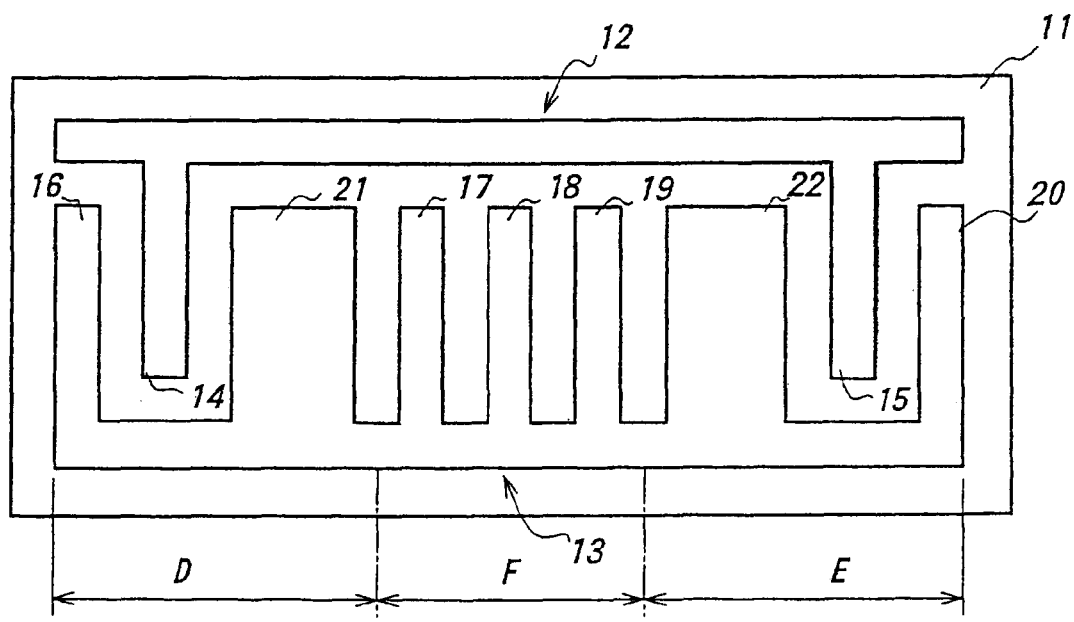

FIG. 4A - Prior Art
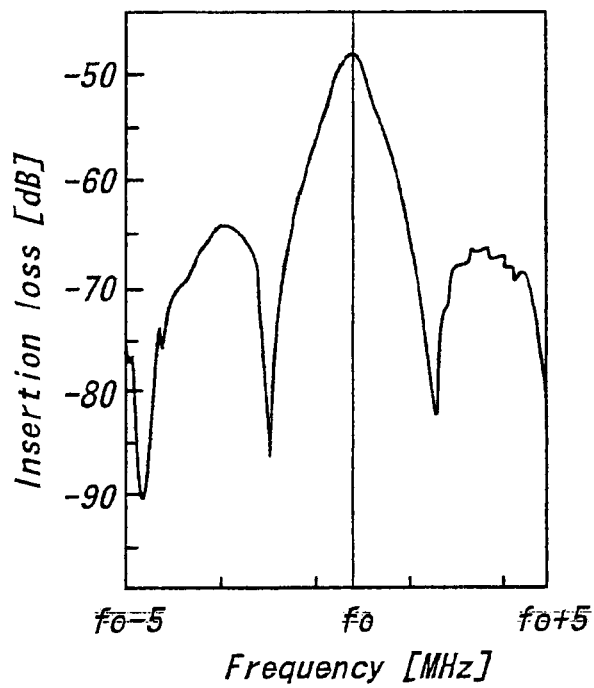
FIG. 4B
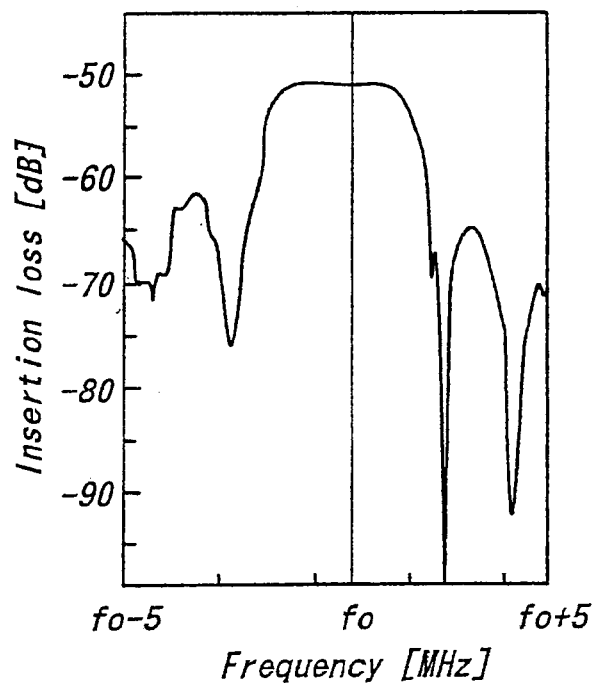

UNIDIRECTIONAL TRANSDUCER AND SAW FILTER COMPRISING THE SAME

FIELD OF THE INVENTION

The present invention relates to a single phase unidirectional transducer and a SAW (surface acoustic wave) filter comprising such a transducer.

DESCRIPTION OF THE RELATED ART

A single phase unidirectional transducer and surface acoustic filter comprising such transducer are disclosed in JP-B-62-31860 and U.S. Pat. No. 5,703,427, for example.

According to the above-mentioned SAW filter comprising a single phase unidirectional transducer, it is possible to improve the insertion loss substantially by remarkably increasing the unidirectional property based on an asymmetric electrode structure and by properly utilizing an excitation effect and reflection effect of electrode fingers on the electrode structure.

However, due to the increased unidirectional property, the SAW filter comprising such single phase unidirectional transducer gives rise to a tendency to degrade the attenuation property of the filter and increase the ripple of the filter. In order to overcome the degradation of the attenuation property and the increase of the ripple, the single phase unidirectional transducer as shown in FIG. 1 is disclosed in 1994 URTRASONIC SYMPOSIUM-1, "A New Concept in SPUDT Design: the RSPUDT (Resonant SPUDT)*" by P. Venturea, M. Solal, P. Dufilié**, J. M. Hodé and F. Roux."

The unidirectional transducer disclosed by Ventura et al. includes a rectangular quartz substrate 1 as a piezoelectric substrate, a positive electrode 2 formed on the quartz substrate 1 and a negative electrode 3 formed on the quartz substrate 1. The positive electrode 2 comprises a plurality of electrode fingers 4, 5 each having a width $\lambda/8$ as measured in the propagation direction of the fundamental surface acoustic wave; wherein $\lambda$ represents a propagation wavelength of the fundamental surface acoustic wave. The negative electrode 3 comprises a plurality of electrode fingers 6, 7, 8 each having a width $\lambda/8$ as measured in the propagation direction of the surface acoustic wave and a plurality of electrode fingers 9, 10 each having a width $3\lambda/8$ as measured in the propagation direction of the surface acoustic wave.

The electrode fingers of the positive electrode 2 and the negative electrode 3 constitute a first group A generating a combined wave of an excited wave and a reflected wave with the propagation direction toward the right side in FIG. 1, a second group B generating a combined wave of an excited wave and a reflected wave with the propagation direction toward the left side in FIG. 1, and a third group C serving to match the phase of the combined wave generated in the first group A and the phase of the combined wave generated in the second group B. The first group A is constituted by electrode fingers 9, 4 and 6, the second group B is constituted by electrode fingers 8, 5 and 10, and the third group C is constituted by electrode finger 7.

If such a unidirectional transducer is used as an input transducer, for example, in the SAW filter, the number of the first groups A is equal to or larger than that of the second groups B. As the surface acoustic wave generated in the first groups A is combined with the surface acoustic wave generated in the second groups B and these surface acoustic waves influence one another, a weighting of the reflection and the excitation of the surface acoustic wave is performed. It is thus possible to improve the attenuation property and reduce the ripple by adjusting the surface acoustic wave generated in the first group A.

However, in the case of the unidirectional transducer with an electrode structure as shown in FIG. 1, the unidirectional property is so remarkable that only a rough adjustment of the surface acoustic wave can be performed. This makes it difficult to control the surface acoustic wave and achieve a substantial reduction of the ripple of the SAW filter.

DISCLOSURE OF THE INVENTION

It is an object of the present invention to provide single phase unidirectional transducer and a SAW filter comprising such transducer which is effective in achieving the substantial reduction of the ripple.

According to the present invention, there is provided a unidirectional transducer for a SAW filter comprising: a piezoelectric substrate and a first electrode formed on the substrate. The first electrode comprises a plurality of electrode fingers, the electrode fingers each having a width about $\lambda/8$ in a propagation direction of a fundamental surface acoustic wave with a propagation wavelength $\lambda$.

A second electrode is formed on the substrate so as to be substantially parallel to the first electrode, and comprises a plurality of first and second electrode fingers, the first electrode fingers each having a width about $\lambda/8$ in the propagation direction of the fundamental surface acoustic wave, and the second electrode fingers each having a width about $3\lambda/8$ in the propagation direction of the fundamental surface acoustic wave.

A first group comprises one second electrode finger, one electrode finger arranged at a center distance $3\lambda/8$ in a direction opposite to the propagation direction from the one second electrode finger, and one first electrode finger arranged at a center distance $5\lambda/8$ in a direction opposite to the propagation direction from the one second electrode finger.

A second group comprises another second electrode finger arranged at center distance $10\lambda/8$ in the propagation direction from the one second electrode finger in the first group, another electrode finger arranged at a center distance $13\lambda/8$ in the propagation direction from the one second electrode finger in the first group, and another first electrode finger arranged at a center distance $15\lambda/8$ in the propagation direction from the one second electrode finger in the first group.

A third group comprises three first electrode fingers arranged at center distances of $3\lambda/8$, $5\lambda/8$ and $7\lambda/8$, respectively, in the propagation direction from the one second electrode finger in the first group.

Traditionally, it was thought that a weighting of the reflection and the excitation of the surface acoustic wave is not performed if the transducer with an electrode structure constituted by the first, the second and the third groups is used in the SAW filter because the surface acoustic wave generated in the first group propagates at the direction opposite to the direction toward the second group, on one hand, and the surface acoustic wave generated in the second group propagates at the direction opposite to the direction toward the first direction, on the other hand, so that these surface acoustic waves do not influence to one another.

However, in fact, the major part of the surface acoustic wave generated in the first group propagates at the direction opposite to the direction toward the second group and the minor part of the surface acoustic wave generated in the first group propagates toward the second group. Similarly, the major part of the surface acoustic wave generated in the second group propagates at the direction opposite to the direction toward the first group and the minor part of the surface acoustic wave generated in the second group propagates toward the first group. As a result, the surface acoustic wave generated in the first group and propagating at the direction opposite to the direction toward the second group is influenced by the surface acoustic wave propagating toward the first group, and the surface acoustic wave generated in the second group and propagating at the direction opposite to the direction toward the first group is influenced by the surface acoustic wave propagating toward the second group.

Therefore, it is possible to adjust the surface acoustic wave finely, control the surface acoustic wave easily and achieve substantial reduction of the ripple easily. In this case, three electrode fingers in the third group interposed between the first group and the second group serve to match the phase of the surface acoustic wave generated in the first group to the phase of the surface acoustic wave generated in the second group.

If the unidirectional transducer according to the present invention is used as the input transducer in the SAW filter, the number of the second groups is usually equal to or larger than that of the first groups. On the other hand, if the unidirectional transducer according to the present invention is used as the output transducer in the SAW filter, the number of the first groups is usually equal to or larger than that of the second groups. The unidirectional transducer according to the present invention, in addition to the first, second and third groups discussed above, can be formed to incorporate other electrode structures. It is also possible to perform thinning of the electrode structure.

According to the present invention, there is provided a SAW filter comprising: a substrate, an input transducer formed on the substrate, in which an electric signal is input from external and in which the electrical signal is transformed into a surface acoustic wave, and an output transducer formed on the substrate, in which the surface acoustic wave excited in the input transducer is transformed into the electric signal, and in which the electric signal is output to external.

At least one of the input and output transducers comprises a unidirectional transducer. The transducer comprises a first electrode formed on the substrate comprising a plurality of electrode fingers, the electrode fingers each having a width about $\lambda/8$ in a propagation direction of a fundamental surface acoustic wave with a propagation wavelength $\lambda$.

A second electrode is formed on the substrate so as to be substantially parallel to the first electrode, and comprises a plurality of first and second electrode fingers, the first electrode fingers each having a width about $\lambda/8$ in a propagation direction of the fundamental surface acoustic wave, and the second electrode fingers each having a width of about $3\lambda/8$ in the propagation direction of the fundamental surface acoustic wave.

A first group comprises one second electrode finger, one electrode finger arranged at a center distance $3\lambda/8$ in a direction opposite to the propagation direction from the one second electrode finger, and one first electrode finger arranged at a center distance $5\lambda/8$ in a direction opposite to the propagation direction from the one second electrode finger.

A second group comprises another second electrode finger arranged at a center distance $10\lambda/8$ in the propagation direction from the one second electrode finger in the first group, another electrode finger arranged at a center distance $13\lambda/8$ in the propagation direction from the one second electrode finger in the first group, and another first electrode finger arranged at a center distance $15\lambda/8$ in the propagation direction from the one second electrode finger in the first group.

A third group comprises three first electrode fingers arranged at center distances of $3\lambda/8$, $5\lambda/8$ and $7\lambda/8$, respectively, in the propagation direction from the one second electrode finger in the first group.

According to the present invention, it is possible to achieve a substantial reduction of the ripple of the SAW filter.

BRIEF DESCRIPTION OF THE DRAWINGS

FIG. 1 is a schematic diagram showing a conventional unidirectional transducer;

FIG. 2 is a schematic diagram showing an embodiment of the unidirectional transducer according to the present invention;

FIG. 4A is a schematic diagram showing a relation between a frequency and an insertion loss obtained from the conventional SAW filter, and FIG. 4B is a schematic diagram showing a relation between a frequency and an insertion loss obtained from the SAW filter according to the present invention.

DETAILED DESCRIPTION OF THE INVENTION

Figure 3:
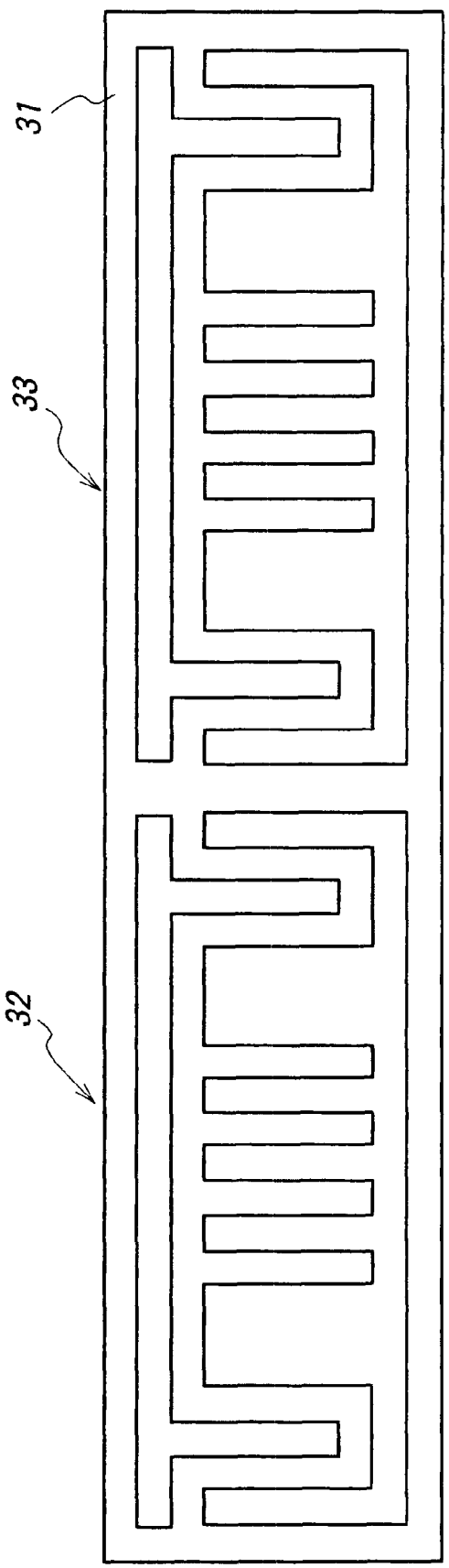
FIG. 3 is a schematic diagram showing an embodiment of the SAW filter according to the present invention.

Embodiments of the unidirectional transducer and the filter comprising such a unidirectional transducer will be explained with reference to the accompanying drawings. It is to be noted that the drawings are schematical and not to scale.

FIG. 2 is a schematic diagram showing an embodiment of the unidirectional transducer according to the present invention. If the unidirectional transducer is used as an input transducer, the surface acoustic wave propagates toward the right side in FIG. 2. On the other hand, if the unidirectional transducer is used as an output transducer, the surface acoustic wave propagates toward left side in FIG. 2.

In the embodiment, a rectangular quartz substrate 11 is used as a piezoelectric substrate. As the quartz substrate 11 has a little bandwidth variation against the temperature variation, it is possible to maintain a little pass band variation against the temperature variation of the filter as a whole.

The unidirectional transducer comprises a positive electrode 12 as the first electrode and a negative electrode 13 as the second electrode. The positive electrode 12 has a plurality of electrode fingers 14, 15, the electrode fingers each having a width about $\lambda/8$ in the propagation direction of the fundamental surface acoustic wave, wherein $\lambda$ represents the propagation wavelength of the surface acoustic wave. The negative electrode 13 comprises a plurality of electrode fingers 16 to 20 as the first electrode fingers, the electrode fingers each having a width about $\lambda/8$ in the propagation direction of the fundamental surface acoustic wave; and a plurality of electrode fingers 21, 22 as the second electrode fingers, the electrode fingers each having a width about $3\lambda/8$ in the propagation direction of the fundamental surface acoustic wave.

In the electrode structure of the unidirectional transducer, if the propagation direction of the surface acoustic wave is the right direction in FIG. 2, a first group D comprises the electrode finger 21, and the electrode fingers 14 and 16 arranged at a center distance 3λ/8 and 5λ/8 in a direction opposite to the propagation direction from the electrode finger 21, respectively; a second group E comprises the electrode fingers 22, 15 and 20 arranged at a center distance 10λ/8, 13λ/8 and 15λ/8 in the propagation direction from the electrode finger 21, respectively; and a third group F comprises three electrode fingers 17, 18 and 19 arranged at a center distance 3λ/8, 5λ/8 and 7λ/8 in the propagation direction from the electrode finger 21, respectively.

The operation of the embodiment will be explained hereinafter. If the unidirectional transducer in FIG. 2 is used as at least one of the input transducer and the output transducer in the SAW filter, the major part of the combined wave of the excited wave and the reflected wave generated in the second group E propagate at the propagation direction, in other words, toward the output transducer, and the minor part of the combined wave propagates at the direction opposite to the propagation direction.

On the other hand, the major part of the combined wave of the excited wave and the reflected wave generated in the first group D propagate at the direction opposite to the propagation direction, in other words, at the direction opposite to the direction toward the output transducer, and the minor part of the combined wave propagate toward the output transducer.

Three electrode fingers 17, 18, 19 in the third group F interposed between the first group D and the second group E serve to match the phase of the combined wave in the first group D to the phase of the combined wave in the second group E.

If the unidirectional transducer in the embodiment is used as the input transducer, for example, in the SAW filter, the surface acoustic wave generated in the second group E and propagating at the direction opposite to the direction toward the first group D is influenced by the surface acoustic wave propagating toward the second group E.

It is thus possible to adjust the surface acoustic wave finely, control the surface acoustic wave easily and achieve the substantial reduction of the ripple of the SAW filter easily.

If the unidirectional transducer in the embodiment is used as the input transducer in the SAW filter, the number of the second group E is usually equal to or larger than that of the first group D. On the other hand, if the unidirectional transducer in the embodiment is used as the output transducer in the SAW filter, the number of the first group D is usually equal to or larger than that of the second group E.

FIG. 3 is a schematic diagram showing an embodiment of the SAW filter according to the present invention. This SAW filter comprises a quartz substrate 31, an input transducer 32 formed on the quartz substrate 31, and an output transducer 33 formed on the quartz substrate 31.

Both the input transducer 32 and the output transducer 33 have the same electrode structure as that of the unidirectional transducer in FIG. 2. In this case, the number of the second groups E (FIG. 2) is equal to or larger than that of the first group D (FIG. 2) in the input transducer 32, and the number of the first group D (FIG. 2) is equal to or larger than that of the second group E (FIG. 2) in the output transducer 33.

FIG. 4A is a schematic diagram showing a relation between a frequency and an insertion loss obtained from the conventional SAW filter, and FIG. 4B is a schematic diagram showing a relation between a frequency and an insertion loss obtained from the SAW filter according to the present invention. In FIGS. 4A and 4B, vertical axes of FIGS. 4A and 4B represent an insertion loss, respectively, parallel axes of FIGS. 4A and 4B represent a frequency, respectively, and $f_0$ represents a center frequency. In the case of FIG. 4A, the unidirectional transducer in FIG. 1 is used as the input transducer and a transducer with a λ/8 type of a split electrode structure is used as the output transducer. In case of FIG. 4B, the unidirectional transducer in FIG. 2 is used as the input transducer and a transducer with a λ/8 type of a split electrode structure is used as the output transducer. Also, in the case of FIG. 4A, each of the number of the first groups A and the second groups B of the input transducer is 25, and the number of paired electrode fingers of the output transducer is 10. In the case of FIG. 4B, each of the number of the first groups D and the second groups E of the input transducer is 25, and the number of paired electrode fingers of the output transducer is 10.

According to the waveform shown in FIG. 4A, as the unidirectional property of the SAW filter is too strong to control the surface acoustic wave, the reduction of the ripple is not large. As a result, a top of the waveform tends to be sharpened. On the other hand, according to the waveform shown in FIG. 4B, as the surface acoustic wave is well controlled and the unidirectional property around the center frequency $f_0$ is weakened, the ripple is substantially reduced. As a result, a top of the waveform is flat, and thus it is possible to obtain a good wide band property.

While the present invention has been described above with reference to certain preferred embodiments, it should be noted that they were present by way of examples only and various changes and/or modifications may be made without departing from the scope of the invention. For example, the quartz substrate is used as the piezoelectric substrate in the above-mentioned embodiment, however, it is possible to use $LiTaO_3$, $Li_2B_4O_7$, $Li_3Ga_6SiO_{14}$, etc.

In the above-mentioned embodiment of the unidirectional transducer, the unidirectional transducer with one first group and one second group is explained, however, it is possible to set each of the number of the first group and the second group as well as the combination of the first group and the second group to the most suitable condition in accordance with the required property of the transducer, to have any other electrode structures than the first, the second and the third groups, and to adopt the thinning.

In the SAW filter in FIG. 3, it is possible to use any other type of the transducer (for example, any other type of the unidirectional transducer or a bidirectional transducer) as one of the input transducer and the output transducer.

Moreover, the first electrode of the unidirectional transducer may form the negative electrode, with the second electrode of the unidirectional transducer forming the positive electrode.

What is claimed is:

1. A unidirectional transducer for a SAW filter comprising:
    a piezoelectric substrate;
    a first electrode formed on said substrate and comprising a plurality of electrode fingers, said electrode fingers each having a width about λ/8 in a propagation direction of a fundamental surface acoustic wave with a propagation wavelength λ; and
    a second electrode formed on said substrate so as to be substantially parallel to said first electrode, and comprising a plurality of first and second electrode fingers, said first electrode fingers each having a width about $\lambda/8$ in the propagation direction of the fundamental surface acoustic wave, and said second electrode fingers each having a width about $3\lambda/8$ in the propagation direction of the fundamental surface acoustic wave;

a first group comprising one second electrode finger, one electrode finger arranged at a center distance $3\lambda/8$ in a direction opposite to said propagation direction from said one second electrode finger, and one first electrode finger arranged at a center distance $5\lambda/8$ in a direction opposite to said propagation direction from said one second electrode finger;

a second group comprising another second electrode finger arranged at center distance $10\lambda/8$ in said propagation direction from said one second electrode finger in said first group, another electrode finger arranged at a center distance $13\lambda/8$ in said propagation direction from said one second electrode finger in said first group, and another first electrode finger arranged at a center distance $15\lambda/8$ in said propagation direction from said one second electrode finger in said first group; and a third group comprising three further first electrode fingers arranged at center distances of $3\lambda/8$, $5\lambda/8$ and $7\lambda/8$, respectively, in said propagation direction from said one second electrode finger in said first group.

2. A SAW filter comprising: a substrate; an input transducer formed on said substrate, in which an electric signal is input from external and in which said electrical signal is transformed into a surface acoustic wave; and an output transducer formed on said substrate, in which the surface acoustic wave excited in said input transducer is transformed into the electric signal, and in which said electric signal is output to external;

at least one of said input and output transducers comprising a unidirectional transducer, said transducer comprising:

a first electrode formed on said substrate and comprising a plurality of electrode fingers, said electrode fingers each having a width about $\lambda/8$ in a propagation direction of a fundamental surface acoustic wave with a propagation wavelength $\lambda$; and a second electrode formed on said substrate so as to be substantially parallel to said first electrode, and comprising a plurality of first and second electrode fingers, said first electrode fingers each having a width about $\lambda/8$ in the propagation direction of the fundamental surface acoustic wave, and said second electrode fingers each having a width about $3\lambda/8$ in the propagation direction of the fundamental surface acoustic wave;

a first group comprising one second electrode finger, one electrode finger arranged at a center distance $3\lambda/8$ in a direction opposite to said propagation direction from said one second electrode finger, and one first electrode finger arranged at a center distance $5\lambda/8$ in a direction opposite to said propagation direction from said one second electrode finger;

a second group comprising another second electrode finger arranged at a center distance $10\lambda/8$ in said propagation direction from said one second electrode finger in said first group, another electrode finger arranged at a center distance $13\lambda/8$ in said propagation direction from said one second electrode finger in said first group, and another first electrode finger arranged at a center distance $15\lambda/8$ in said propagation direction from said one second electrode finger in said first group; and a third group comprising three further first electrode fingers arranged at center distances of $3\lambda/8$, $5\lambda/8$ and $7\lambda/8$, respectively, in said propagation direction from said one second electrode finger in said first group.

* * * * *